United States Patent
Wang et al.

(10) Patent No.: US 9,640,764 B2
(45) Date of Patent: May 2, 2017

(54) CARBON NANOTUBE-BASED TERNARY COMPARATOR

(71) Applicant: Ningbo University, Ningbo (CN)

(72) Inventors: Pengjun Wang, Ningbo (CN); Weitong Tang, Ningbo (CN); Qian Wang, Ningbo (CN)

(73) Assignee: NINGBO UNIVERSITY, Ningbo (CN)

( * ) Notice: Subject to any disclaimer, the term of this patent is extended or adjusted under 35 U.S.C. 154(b) by 0 days.

(21) Appl. No.: 14/801,815

(22) Filed: Jul. 16, 2015

(65) Prior Publication Data
US 2016/0268512 A1  Sep. 15, 2016

(30) Foreign Application Priority Data

Mar. 11, 2015 (CN) .......................... 2015 1 0106089

(51) Int. Cl.
*H03K 5/22* (2006.01)
*H01L 51/00* (2006.01)
*H03K 5/24* (2006.01)

(52) U.S. Cl.
CPC ........... *H01L 51/0048* (2013.01); *H03K 5/22* (2013.01); *H03K 5/2472* (2013.01)

(58) Field of Classification Search
CPC ..... H01L 51/0048; H03K 5/2472; H03K 5/22
See application file for complete search history.

(56) References Cited

U.S. PATENT DOCUMENTS

| | | | |
|---|---|---|---|
| 6,339,622 B1* | 1/2002 | Kim | G09G 3/3611 326/60 |
| 8,416,840 B2* | 4/2013 | Lee | H04L 25/49 375/222 |

* cited by examiner

*Primary Examiner* — Jung Kim
(74) *Attorney, Agent, or Firm* — Matthias Scholl, PC; Matthias Scholl

(57) ABSTRACT

A carbon nanotube-based ternary comparator including a first decoder, a second decoder, and a comparison circuit. The comparison circuit includes: a first comparison unit for producing a greater-than-or-equal-to signal, and a second comparison unit for producing a less-than-or-equal-to signal. A first two-bit ternary signal is input into the signal input terminal of the first decoder. A first three-bit binary signal and a phase inverted signal of the first three-bit binary signal are output from a signal output terminal of the first decoder. A second two-bit ternary signal is input into the signal input terminal of the second decoder. A second three-bit binary signal and a phase inverted signal of the second three-bit binary signal are output from the signal output terminal of the second decoder.

4 Claims, 7 Drawing Sheets

CARBON NANOTUBE-BASED TERNARY COMPARATOR

CROSS-REFERENCE TO RELATED APPLICATIONS

Pursuant to 35 U.S.C. §119 and the Paris Convention Treaty, this application claims the benefit of Chinese Patent Application No. 201510106089.4 filed Mar. 11, 2015, the contents of which are incorporated herein by reference.

BACKGROUND OF THE INVENTION

Field of the Invention

The invention relates to a ternary comparator, and more particularly to a carbon nanotube-based ternary comparator.

Description of the Related Art

Comparator is a key element of functional circuits. The conventional binary logic system has limited information carrying capacity, low operation speed, and complex interconnections.

Carbon nanotube field effect transistor (CNFET) is a new type of element having low power and high performance.

Until now, a carbon nanotube-based ternary comparator possessing low power on the basis of CNFET has not been reported.

SUMMARY OF THE INVENTION

In view of the above-described problems, it is one objective of the invention to provide a carbon nanotube-based ternary comparator that has relatively low power consumption on the basis of correct logic functions.

To achieve the above objective, in accordance with one embodiment of the invention, there is provided a carbon nanotube-based ternary comparator comprising: a first decoder, a second decoder, and a comparison circuit. A first two-bit ternary signal is input into a signal input terminal of the first decoder. A first three-bit binary signal and a phase inverted signal of the first three-bit binary signal are output from a signal output terminal of the first decoder. A second two-bit ternary signal is input into a signal input terminal of the second decoder. A second three-bit binary signal and a phase inverted signal of the second three-bit binary signal are output from a signal output terminal of the second decoder. The comparison circuit comprises: a first comparison unit for producing a greater-than-or-equal-to signal and a second comparison unit for producing a less-than-or-equal-to signal.

The first comparison unit comprises: a first CNFET, a second CNFET, a third CNFET, a fourth CNFET, a fifth CNFET, a sixth CNFET, a seventh CNFET, an eighth CNFET, a ninth CNFET, a tenth CNFET, a eleventh CNFET, a twelfth CNFET, a thirteenth CNFET, a fourteenth CNFET, a fifteenth CNFET, a sixteenth CNFET, a seventeenth CNFET, an eighteenth CNFET, a nineteenth CNFET, a twentieth CNFET, a twenty-first CNFET, a twenty-second CNFET, a twenty-third CNFET, a twenty-fourth CNFET, a twenty-fifth CNFET, a twenty-sixth CNFET, a twenty-seventh CNFET, a twenty-eighth CNFET, a twenty-ninth CNFET, a thirtieth CNFET, a thirty-first CNFET, a thirty-second CNFET, a thirty-third CNFET, a thirty-fourth CNFET, a thirty-fifth CNFET, a thirty-sixth CNFET, a thirty-seventh CNFET, and a thirty-eighth CNFET. Each of the above CNFET comprises: a gate, a drain, and a source.

The first CNFET, the second CNFET, the third CNFET, the fourth CNFET, the fifth CNFET, the sixth CNFET, the seventh CNFET, the eighth CNFET, the ninth CNFET, the tenth CNFET, the eleventh CNFET, the twelfth CNFET, the thirteenth CNFET, the fourteenth CNFET, the fifteenth CNFET, the sixteenth CNFET, the seventeenth CNFET, the eighteenth CNFET, and the nineteenth CNFET are all P-type CNFETs. The twentieth CNFET, the twenty-first CNFET, the twenty-second CNFET, the twenty-third CNFET, the twenty-fourth CNFET, the twenty-fifth CNFET, the twenty-sixth CNFET, the twenty-seventh CNFET, the twenty-eighth CNFET, the twenty-ninth CNFET, the thirtieth CNFET, the thirty-first CNFET, the thirty-second CNFET, the thirty-third CNFET, the thirty-fourth CNFET, the thirty-fifth CNFET, the thirty-sixth CNFET, the thirty-seventh CNFET, and the thirty-eighth CNFET are all N-type CNFETs.

Both the source of the first CNFET and the source of the second CNFET are connected to a power supplier. The drain of the first CNFET, the drain of the second CNFET, the source of the third CNFET, the source of the fourth CNFET, the source of the fifth CNFET, and the source of the sixth CNFET are connected together. The drain of the fifth CNFET, the drain of the sixth CNFET, and the source of the seventh CNFET are connected. The drain of the third CNFET, the drain of the fourth CNFET, the drain of the seventh CNFET, the source of the eighth CNFET, the source of the ninth CNFET, the source of the tenth CNFET, and the source of the eleventh CNFET are connected. The drain of the tenth CNFET, the drain of the eleventh CNFET, and the source of the twelfth CNFET are connected. The drain of the eighth CNFET, the drain of the ninth CNFET, the drain of the twelfth CNFET, the source of the thirteenth CNFET, the source of the fourteenth CNFET, the source of the fifteenth CNFET, and the source of the sixteenth CNFET are connected. The drain of the thirteenth CNFET, the drain of the fourteenth CNFET, the drain of the fifteenth CNFET, the source of the seventeenth CNFET, the source of the eighteenth CNFET, and the source of the nineteenth CNFET are connected. The drain of the sixteenth CNFET, the drain of the seventeenth CNFET, the drain of the eighteenth CNFET, the drain of the nineteenth CNFET, the drain of the twentieth CNFET, the drain of the twenty-first CNFET, the drain of the twenty-second CNFET, and the drain of the twenty-seventh CNFET are connected and a connecting terminal thereof is an output terminal of the greater-than-or-equal-to signal. The source of the twentieth CNFET and the drain of the twenty-third CNFET are connected. The source of the twenty-third CNFET, the source of the thirty-third CNFET, and the drain of the twenty-eighth CNFET are connected. The source of the twenty-eighth CNFET and the drain of the thirty-fourth CNFET are connected. The source of the twenty-seventh CNFET and the drain of the thirty-second CNFET are connected. The source of the twenty-first CNFET and the drain of the twenty-fourth CNFET are connected. The source of the twenty-fourth CNFET, the drain of the thirty-fifth CNFET, and the drain of the twenty-ninth CNFET are connected. The source of the twenty-ninth CNFET and the drain of the thirty-sixth CNFET are connected. The source of the twenty-second CNFET, the drain of the twenty-fifth CNFET, and the drain of the twenty-sixth CNFET are connected. The source of the twenty-fifth CNFET and the drain of the thirtieth CNFET are connected, the source of the thirtieth CNFET and the drain of the thirty-seventh CNFET are connected. The source of the twenty-sixth CNFET and the drain of the thirty-first CNFET are connected. The source of the thirty-first CNFET and the drain of the thirty-eighth CNFET are connected. The source of the thirty-second CNFET, the drain of the thirty-third CNFET, the source of the thirty-fourth CNFET, the source of the thirty-fifth CNFET, the source of the thirty-sixth CNFET, the source of the thirty-seventh CNFET, and the source of the thirty-eighth CNFET are all grounded. The gate of the first CNFET, the gate of the eighth CNFET, the gate of the thirteenth CNFET, the gate of the twenty-first CNFET, the gate of the twenty-fifth CNFET, and the gate of the twenty-seventh CNFET are connected and a connecting terminal thereof are input with a third-bit signal of the first three-bit binary signal. The gate of the second CNFET, the gate of the third CNFET, the gate of the eighteenth CNFET, the gate of the twentieth CNFET, the gate of the thirty-first CNFET, and the gate of the thirty-second CNFET are connected and a connecting terminal thereof are input with a third-bit signal of the first three-bit binary signal are connected and a connecting terminal thereof are input with a third-bit signal of the phase inverted signal of the second three-bit binary signal. The gate of the fourth CNFET, the gate of the fifteenth CNFET, the gate of the twenty-third CNFET, and the gate of the thirty-seventh CNFET are connected and a connecting terminal thereof are input with a second-bit signal of the phase inverted signal of the second three-bit binary signal. The gate of the fifth CNFET, the gate of the twelfth CNFET, the gate of the fourteenth CNFET, the gate of the twenty-eighth CNFET, the gate of the thirtieth CNFET, and the gate of the thirty-fifth CNFET are connected and a connecting terminal thereof are input with a first-bit signal of the first three-bit binary signal. The gate of the sixth CNFET, the gate of the ninth CNFET, the gate of the twenty-fourth CNFET, and the gate of the thirty-fourth CNFET are connected and a connecting terminal thereof are input with a first-bit signal of the phase inverted signal of the second three-bit binary signal. The gate of the seventh CNFET, the gate of the sixteenth CNFET, the gate of the twenty-second CNFET, and the gate of the thirty-third CNFET are connected and a connecting terminal thereof are input with a second-bit signal of the first three-bit binary signal. The gate of the tenth CNFET and the gate of the thirty-sixth CNFET are connected and a connecting terminal thereof are input with a second-bit signal of the second three-bit binary signal. The gate of the eleventh CNFET and the gate of the twenty-ninth CNFET are connected and a connecting terminal thereof are input with a second-bit signal of the phase inverted signal of the first three-bit binary signal. The gate of the seventeenth CNFET and the gate of the twenty-sixth CNFET are connected and a connecting terminal thereof are input with a first-bit signal of the phase inverted signal of the first three-bit binary signal. The gate of the nineteenth CNFET and the gate of the thirty-eighth CNFET are connected and a connecting terminal thereof are input with a first-bit signal of the second three-bit binary signal.

The second comparison unit comprises: a thirty-ninth CNFET, a fortieth CNFET, a forty-first CNFET, a forty-second CNFET, a forty-third CNFET, a forty-fourth CNFET, a forty-fifth CNFET, a forty-sixth CNFET, a forty-seventh CNFET, a forty-eighth CNFET, a forty-ninth CNFET, a fiftieth-CNFET, a fifty-first CNFET, a fifty-second CNFET, a fifty-third CNFET, a fifty-fourth CNFET, a fifty-fifth CNFET, a fifty-sixth CNFET, a fifty-seventh CNFET, a fifty-eighth CNFET, a fifty-ninth CNFET, a sixtieth CNFET, a sixty-first CNFET, a sixty-second CNFET, a sixty-third CNFET, a sixty-fourth CNFET, a sixty-fifth CNFET, a sixty-sixth CNFET, a sixty-seventh CNFET, a sixty-eighth CNFET, a sixty-ninth CNFET, a seventieth CNFET, a seventy-first CNFET, a seventy-second CNFET, a seventy-third CNFET, a seventy-fourth CNFET, a seventy-fifth CNFET, and a seventy-sixth CNFET. Each of the above CNFET comprises: the gate, the drain, and the source.

The thirty-ninth CNFET, the fortieth CNFET, the forty-first CNFET, the forty-second CNFET, the forty-third CNFET, the forty-fourth CNFET, the forty-fifth CNFET, the forty-sixth CNFET, the forty-seventh CNFET, the forty-eighth CNFET, the forty-ninth CNFET, the fiftieth-CNFET, the fifty-first CNFET, the fifty-second CNFET, the fifty-third CNFET, the fifty-fourth CNFET, the fifty-fifth CNFET, the fifty-sixth CNFET, and the fifty-seventh CNFET are all P-type CNFETs. The fifty-eighth CNFET, the fifty-ninth CNFET, the sixtieth CNFET, the sixty-first CNFET, the sixty-second CNFET, the sixty-third CNFET, the sixty-fourth CNFET, the sixty-fifth CNFET, the sixty-sixth CNFET, the sixty-seventh CNFET, the sixty-eighth CNFET, the sixty-ninth CNFET, the seventieth CNFET, the seventy-first CNFET, the seventy-second CNFET, the seventy-third CNFET, the seventy-fourth CNFET, the seventy-fifth CNFET, and the seventy-sixth CNFET are all N-type CNFETs.

Both the source of the thirty-ninth CNFET and the source of the fortieth CNFET are connected to a power supplier. The drain of the thirty-ninth CNFET, the drain of the fortieth CNFET, the source of the forty-first CNFET, the source of the forty-second CNFET, the source of the forty-third CNFET, and the source of the forty-fourth CNFET are connected. The drain of the forty-third CNFET, the drain of the forty-fourth CNFET, and the source of the forty-fifth CNFET are connected. The drain of the forty-first CNFET, the drain of the forty-second CNFET, the drain of the forty-fifth CNFET, the source of the forty-sixth CNFET, the source of the forty-seventh CNFET, the source of the forty-eighth CNFET, and the source of the forty-ninth CNFET are connected. The drain of the forty-eighth CNFET, the drain of the forty-ninth CNFET, and the source of the fiftieth-CNFET are connected. The drain of the forty-sixth CNFET, the drain of the forty-seventh CNFET, the drain of the fiftieth-CNFET, the source of the fifty-first CNFET, the source of the fifty-second CNFET, the source of the fifty-third CNFET, and the source of the fifty-fourth CNFET are connected. The drain of the fifty-first CNFET, the drain of the fifty-second CNFET, the drain of the fifty-third CNFET, the source of the fifty-fifth CNFET, the source of the fifty-sixth CNFET, and the source of the fifty-seventh CNFET are connected. The drain of the fifty-fourth CNFET, the drain of the fifty-fifth CNFET, the drain of the fifty-sixth CNFET, the drain of the fifty-seventh CNFET, the drain of the fifty-eighth CNFET, the drain of the fifty-ninth CNFET, the drain of the sixtieth CNFET, and the drain of the sixty-fifth CNFET are connected and a connecting terminal thereof is an output terminal of the less-than-or-equal-to signal. The source of the fifty-eighth CNFET and the drain of the sixty-first CNFET are connected. The source of the sixty-first CNFET, the drain of the seventy-first CNFET, and the drain of the sixty-sixth CNFET are connected. The source of the sixty-sixth CNFET and the drain of the seventy-second CNFET are connected. The source of the sixty-fifth CNFET and the drain of the seventieth CNFET are connected. The source of the fifty-ninth CNFET and the drain of the sixty-second CNFET are connected. The source of the sixty-second CNFET, the drain of the seventy-third CNFET, and the drain of the sixty-seventh CNFET are connected. The source of the sixty-seventh CNFET and the drain of the seventy-fourth CNFET are connected. The source of the sixtieth CNFET, the drain of the sixty-third CNFET, and the drain of the sixty-fourth CNFET are connected. The source of the sixty-third CNFET and the drain of the sixty-eighth CNFET are connected. The source of the sixty-eighth CNFET and the drain of the seventy-fifth CNFET are connected. The source of the sixty-fourth CNFET and the drain of the sixty-ninth CNFET are connected. The source of the sixty-ninth CNFET and the drain of the seventy-sixth CNFET are connected. The source of the seventieth CNFET, the source of the seventy-first CNFET, the source of the seventy-second CNFET, the source of the seventy-third CNFET, the source of the seventy-fourth CNFET, the source of the seventy-fifth CNFET, and the source of the seventy-sixth CNFET are all grounded.

The gate of the thirty-ninth CNFET, the gate of the forty-first CNFET, the gate of the fifty-fifth CNFET, the gate of the fifty-eighth CNFET, the gate of the sixty-fourth CNFET, and the gate of the sixty-fifth CNFET are connected and a connecting terminal thereof are input with a third-bit signal of the phase inverted signal of the first three-bit binary signal. The gate of the fortieth CNFET, the gate of the forty-sixth CNFET, the gate of the fifty-first CNFET, the gate of the fifty-ninth CNFET, the gate of the sixty-third CNFET, and the gate of the seventieth CNFET are connected and a connecting terminal thereof are input with a third-bit signal of the second three-bit binary signal. The gate of the forty-second CNFET, the gate of the fifty-third CNFET, the gate of the sixty-first CNFET, and the gate of the seventy-fifth CNFET are connected and a connecting terminal thereof are input with the second-bit signal of the phase inverted signal of the first three-bit binary signal. The gate of the forty-third CNFET, the gate of the forty-seventh CNFET, the gate of the sixty-second CNFET, and the gate of the sixty-sixth CNFET are connected and a connecting terminal thereof are input with the first-bit signal of the phase inverted signal of the first three-bit binary signal. The gate of the forty-fourth CNFET, the gate of the fiftieth-CNFET, the gate of the fifty-second CNFET, the gate of the sixty-eighth CNFET, the gate of the seventy-second CNFET, and the gate of the seventy-third CNFET are connected and a connecting terminal thereof are input with the first-bit signal of the second three-bit binary signal. The gate of the forty-eighth CNFET and the gate of the sixty-seventh CNFET are connected and a connecting terminal thereof are input with the second-bit signal of the first three-bit binary signal. The gate of the forty-ninth CNFET and the gate of the seventy-fourth CNFET are connected and a connecting terminal thereof are input with the second-bit signal of the phase inverted signal of the second three-bit binary signal. The gate of the fifty-fourth CNFET, the gate of the forty-fifth CNFET, the gate of the sixtieth CNFET, and the gate of the seventy-first CNFET are connected and a connecting terminal thereof are input with the second-bit signal of the second three-bit binary signal. The gate of the fifty-sixth CNFET and the gate of the sixty-ninth CNFET are connected and a connecting terminal thereof are input with the first-bit signal of the phase inverted signal of the second three-bit binary signal. The gate of the fifty-seventh CNFET and the gate of the seventy-sixth CNFET are connected and a connecting terminal thereof are input with the first-bit signal of the first three-bit binary signal.

In a class of this embodiment, the carbon nanotube-based ternary comparator further comprises a converter. The converter comprises: a first inverter, a second inverter, and a NOR gate. An input terminal of the first inverter is connected to an output terminal for outputting the greater-than-or-equal-to signal. An input terminal of the second inverter is connected to an output terminal for outputting the less-than-or-equal-to signal. An output terminal of the first inverter is an output terminal for outputting a less-than signal. An output terminal of the second inverter is an output terminal for outputting a greater-than signal. The output terminal of the first inverter is connected to one input terminal of the NOR gate, and the output terminal of the second inverter is connected to another input terminal of the NOR gate. An output terminal of the NOR gate is an output signal for outputting an equal to signal.

In a class of this embodiment, the carbon nanotube-based ternary comparator further comprises a decoder. The decoder comprises: a third inverter, a fourth inverter, a two-input AND gate, a buffer, and a three-input ternary NOR gate. An input terminal of the third inverter and a first input terminal of the two-input AND gate are connected to an output terminal for outputting a greater than and equal to signal. An input terminal of the fourth inverter and a second input terminal of the two-input AND gate are connected to an output terminal for outputting a less than and equal to signal. An output terminal of the two-input AND gate is connected to an input terminal of the buffer. An output terminal of the buffer, an output terminal of the third inverter, and an output terminal of the further inverter are connected to input terminals of the three-input ternary NOR gate, respectively, and an output terminal of the three-input ternary NOR gate outputs a ternary comparison signal.

In a class of this embodiment, the carbon nanotube-based ternary comparator further comprises: a first gate circuit, a second gate circuit, and a third gate circuit, a fourth gate circuit, a fifth gate circuit, a sixth gate circuit, a seventh gate circuit, and an eighth gate circuit. The first gate circuit comprises a seventy-seventh CNFET and a seventy-eighth CNFET. The seventy-seventh CNFET is the P-type CNFET, and a chiral vector (n, m) thereof is (19, 0). The seventy-eighth CNFET is the N-type CNFET, and the chiral vector (n, m) thereof is (10, 0). The source of the seventy-seventh CNFET is connected to a power supplier. The gate of the seventy-seventh CNFET and the gate of a seventy-eighth CNFET are connected and a connecting terminal thereof is an input terminal. The drain of the seventy-seventh CNFET and the drain of the seventy-eighth CNFET are connected and a connecting terminal thereof is an output terminal. The source of the seventy-eighth CNFET is grounded. The second gate circuit comprises: a seventy-ninth CNFET and an eightieth CNFET. The seventy-ninth CNFET is the P-type CNFET and the chiral vector (n, m) thereof is (10, 0). The eightieth CNFET is the N-type CNFET and the chiral vector (n, m) thereof is (19, 0). The source of the seventy-ninth CNFET is connected to a power supplier. The gate of a seventy-ninth CNFET and the gate of the eightieth CNFET are connected and a connecting terminal thereof is an input terminal. The drain of the seventy-ninth CNFET and the drain of the eightieth CNFET are connected and a connecting terminal thereof is an output terminal. The source of the eightieth CNFET is grounded. Structures of the third gate circuit, the fifth gate circuit, and the seventh gate circuit are the same as that of the first gate circuit, and structures of the fourth gate circuit, the sixth gate circuit, and the eighth gate circuit are the same as that of the second gate circuit. A second-bit signal of the first two-bit ternary signal is input into the first decoder via the first gate circuit and the second gate circuit, and a first-bit signal of the first two-bit ternary signal is input into the first decoder via the third gate circuit and the fourth gate circuit. A second-bit signal of the second two-bit ternary signal is input into the second decoder via the fifth gate circuit and the sixth gate circuit, and a first-bit signal of the second two-bit ternary signal is input into the second decoder via the seventh gate circuit and the eighth gate circuit.

Advantages according to embodiments of the invention are summarized as follows:

The carbon nanotube-based ternary comparator of the invention adopts the CNFETs to design the comparison circuit. The comparison circuit comprises the first comparison unit for producing the greater-than-or-equal-to signal and the second comparison unit for producing the less-than-or-equal-to signal. The first two-bit ternary signal is converted into the first three-bit binary signal and the phase inverted signal of the first three-bit binary signal by the first decoder. The second two-bit ternary signal is converted into the second three-bit binary signal and the phase inverted signal of the first three-bit binary signal by the second decoder. The first three-bit binary signal, the phase inverted signal of the first three-bit binary signal, the second three-bit binary signal, and the phase inverted signal of the second three-bit binary signal are compared via the first comparison unit and the second comparison unit so as to output the greater-than-or-equal-to signal or the less-than-or-equal-to signal. Based on the HSPICE simulation and analysis, the carbon nanotube-based ternary comparator is proved to possess the correct logic functions, relatively smaller area, and obvious low power consumption.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing a carbon nanotube-based ternary comparator are described below. It should be noted that the following examples are intended to describe and not to limit the invention.

Example 1

Figure 1:
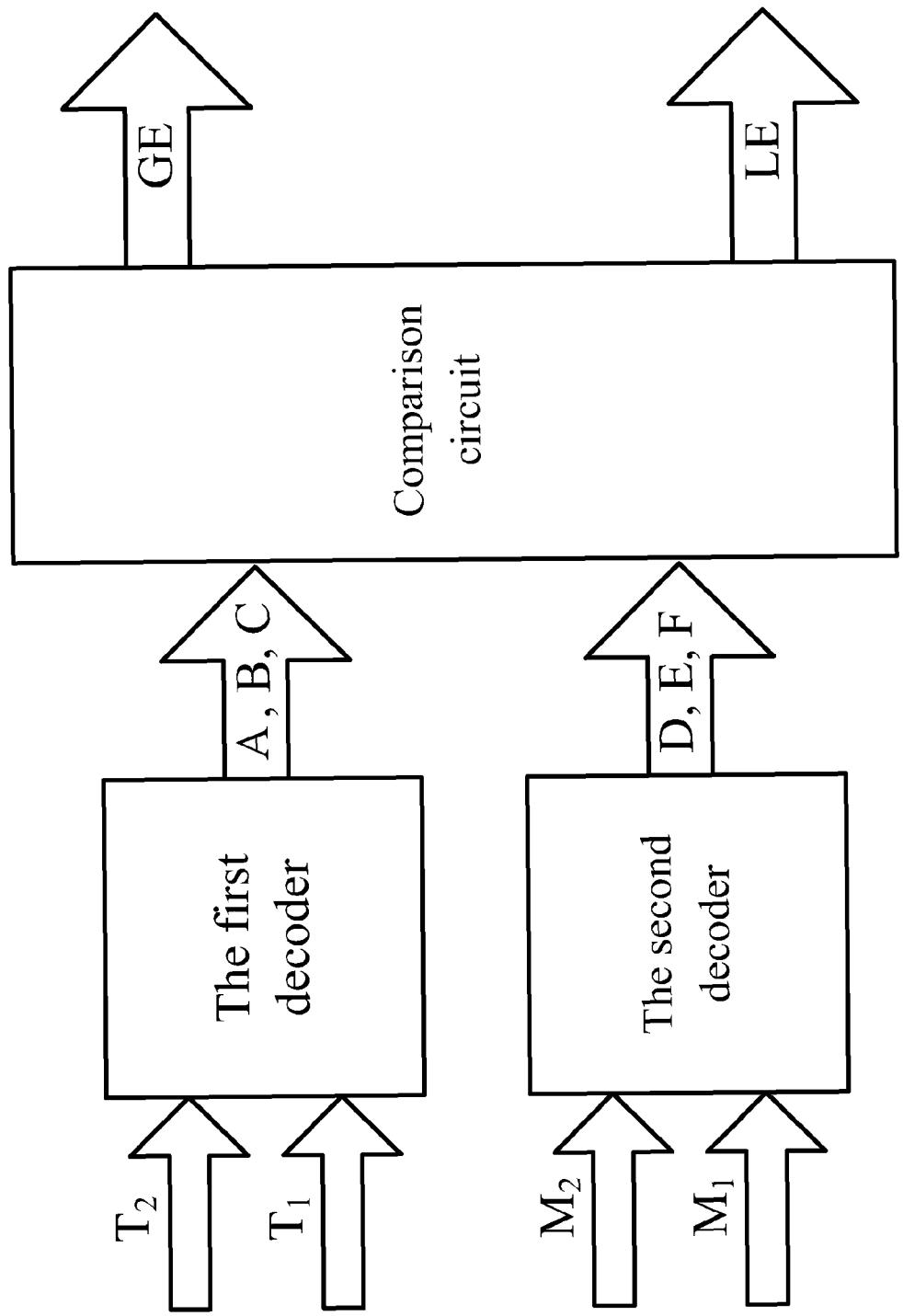
FIG. 1 is a first schematic diagram of a carbon nanotube-based ternary comparator according to one embodiment of the invention.

As shown in FIG. 1, a carbon nanotube-based ternary comparator comprises: a first decoder, a second decoder, and a comparison circuit. A first two-bit ternary signal $T_2 T_1$ is input into a signal input terminal of the first decoder. A first three-bit binary signal ABC and a phase inverted signal $\overline{ABC}$ of the first three-bit binary signal ABC are output from a signal output terminal of the first decoder. A second two-bit ternary signal $M_2 M_1$ is input into a signal input terminal of the second decoder. A second three-bit binary signal DEF and a phase inverted signal $\overline{DEF}$ of the second three-bit binary signal are output from a signal output terminal of the second decoder. The comparison circuit comprises: a first comparison unit for producing a greater-than-or-equal-to GE signal and a second comparison unit for producing a less-than-or-equal-to signal LE.

Figure 3:
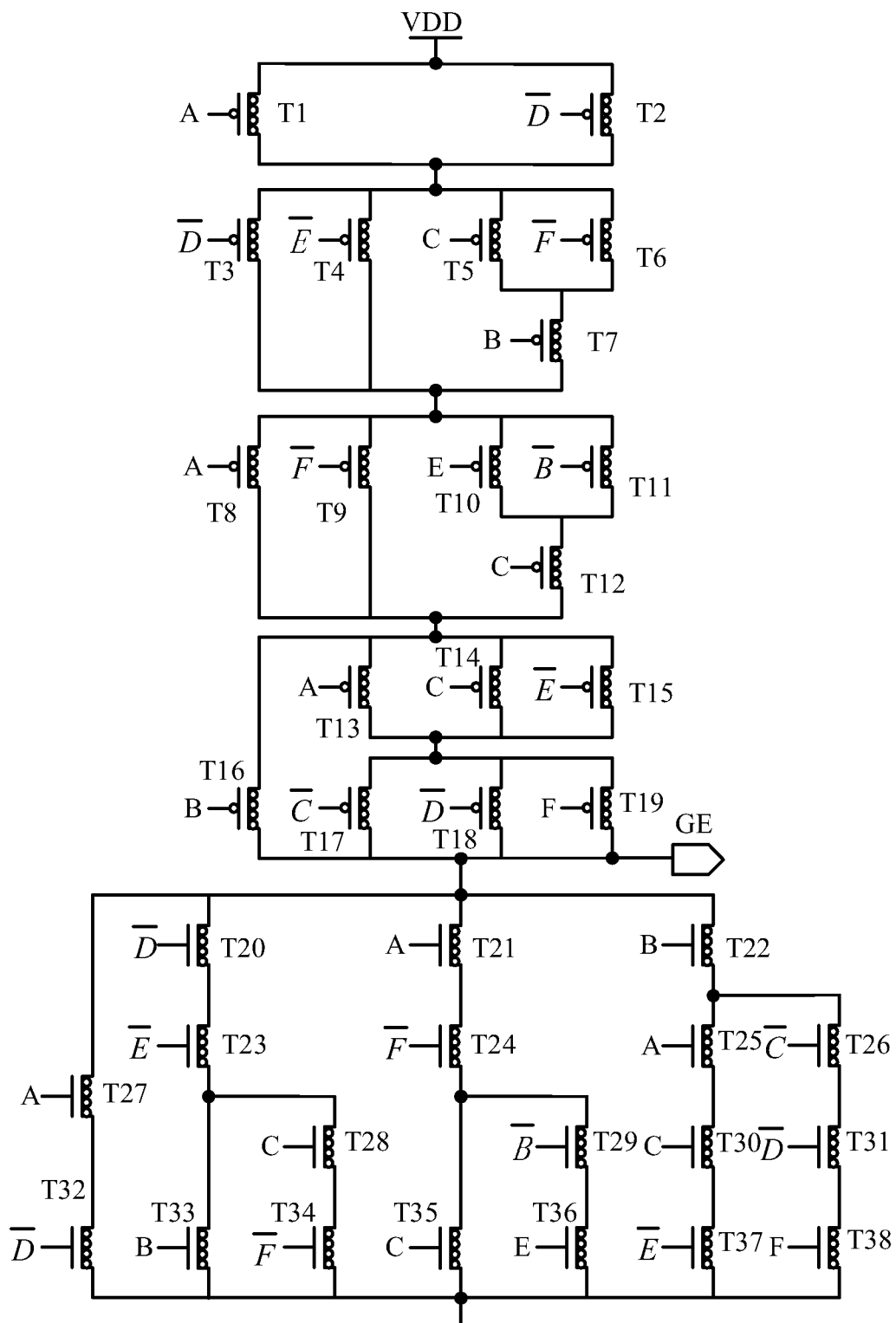
FIG. 3 is a circuit diagram of a first comparison unit according to one embodiment of the invention.

As shown in FIG. 3, the first comparison unit comprises: a first CNFET T1, a second CNFET T2, a third CNFET T3, a fourth CNFET T4, a fifth CNFET T5, a sixth CNFET T6, a seventh CNFET T7, an eighth CNFET T8, a ninth CNFET T9, a tenth CNFET T10, a eleventh CNFET T11, a twelfth CNFET T12, a thirteenth CNFET T13, a fourteenth CNFET T14, a fifteenth CNFET T15, a sixteenth CNFET T16, a seventeenth CNFET T17, an eighteenth CNFET T18, a nineteenth CNFET T19, a twentieth CNFET T20, a twenty-first CNFET T21, a twenty-second CNFET T22, a twenty-third CNFET T23, a twenty-fourth CNFET T24, a twenty-fifth CNFET T25, a twenty-sixth CNFET T26, a twenty-seventh CNFET T27, a twenty-eighth CNFET T28, a twenty-ninth CNFET T29, a thirtieth CNFET T30, a thirty-first CNFET T31, a thirty-second CNFET T32, a thirty-third CNFET T33, a thirty-fourth CNFET T34, a thirty-fifth CNFET T35, a thirty-sixth CNFET T36, a thirty-seventh CNFET T37, and a thirty-eighth CNFET T38. Each of the above CNFET comprises: a gate, a drain, and a source.

The first CNFET T1, the second CNFET T2, the third CNFET T3, the fourth CNFET T4, the fifth CNFET T5, the sixth CNFET T6, the seventh CNFET T7, the eighth CNFET T8, the ninth CNFET T9, the tenth CNFET T10, the eleventh CNFET T11, the twelfth CNFET T12, the thirteenth CNFET T13, the fourteenth CNFET T14, the fifteenth CNFET T15, the sixteenth CNFET T16, the seventeenth CNFET T17, the eighteenth CNFET T18, and the nineteenth CNFET T19 are all P-type CNFETs. The twentieth CNFET T20, the twenty-first CNFET T21, the twenty-second CNFET T22, the twenty-third CNFET T23, the twenty-fourth CNFET T24, the twenty-fifth CNFET T25, the twenty-sixth CNFET T26, the twenty-seventh CNFET T27, the twenty-eighth CNFET T28, the twenty-ninth CNFET T29, the thirtieth CNFET T30, the thirty-first CNFET T31, the thirty-second CNFET T32, the thirty-third CNFET T33, the thirty-fourth CNFET T34, the thirty-fifth CNFET T35, the thirty-sixth CNFET T36, the thirty-seventh CNFET T37, and the thirty-eighth CNFET T38 are all N-type CNFETs.

Both the source of the first CNFET T1 and the source of the second CNFET T2 are connected to a power supplier. The drain of the first CNFET T1, the drain of the second CNFET T2, the source of the third CNFET T3, the source of the fourth CNFET T4, the source of the fifth CNFET T5, and the source of the sixth CNFET T6 are connected together. The drain of the fifth CNFET T5, the drain of the sixth CNFET T6, and the source of the seventh CNFET T7 are connected. The drain of the third CNFET T3, the drain of the fourth CNFET T4, the drain of the seventh CNFET T7, the source of the eighth CNFET T8, the source of the ninth CNFET T9, the source of the tenth CNFET T10, and the source of the eleventh CNFET T11 are connected. The drain of the tenth CNFET T10, the drain of the eleventh CNFET T11, and the source of the twelfth CNFET T12 are connected. The drain of the eighth CNFET T8, the drain of the ninth CNFET T9, the drain of the twelfth CNFET T12, the source of the thirteenth CNFET T13, the source of the fourteenth CNFET T14, the source of the fifteenth CNFET T15, and the source of the sixteenth CNFET T16 are connected. The drain of the thirteenth CNFET T13, the drain of the fourteenth CNFET T14, the drain of the fifteenth CNFET T15, the source of the seventeenth CNFET T17, the source of the eighteenth CNFET T18, and the source of the nineteenth CNFET T19 are connected. The drain of the sixteenth CNFET T16, the drain of the seventeenth CNFET T17, the drain of the eighteenth CNFET T18, the drain of the nineteenth CNFET T19, the drain of the twentieth CNFET T20, the drain of the twenty-first CNFET T21, the drain of the twenty-second CNFET T22, and the drain of the twenty-seventh CNFET T27 are connected and a connecting terminal thereof is an output terminal of the greater-than-or-equal-to signal. The source of the twentieth CNFET T20 and the drain of the twenty-third CNFET T23 are connected. The source of the twenty-third CNFET T23, the source of the thirty-third CNFET T33, and the drain of the twenty-eighth CNFET T28 are connected. The source of the twenty-eighth CNFET T28 and the drain of the thirty-fourth CNFET T34 are connected. The source of the twenty-seventh CNFET T27 and the drain of the thirty-second CNFET T32 are connected. The source of the twenty-first CNFET T21 and the drain of the twenty-fourth CNFET T24 are connected. The source of the twenty-fourth CNFET T24, the drain of the thirty-fifth CNFET T35, and the drain of the twenty-ninth CNFET T29 are connected. The source of the twenty-ninth CNFET T29 and the drain of the thirty-sixth CNFET T36 are connected. The source of the twenty-second CNFET T22, the drain of the twenty-fifth CNFET T25, and the drain of the twenty-sixth CNFET T26 are connected. The source of the twenty-fifth CNFET T25 and the drain of the thirtieth CNFET T30 are connected, the source of the thirtieth CNFET T30 and the drain of the thirty-seventh CNFET T37 are connected. The source of the twenty-sixth CNFET T26 and the drain of the thirty-first CNFET T31 are connected. The source of the thirty-first CNFET T31 and the drain of the thirty-eighth CNFET T38 are connected. The source of the thirty-second CNFET T32, the drain of the thirty-third CNFET T33, the source of the thirty-fourth CNFET T34, the source of the thirty-fifth CNFET T35, the source of the thirty-sixth CNFET T36, the source of the thirty-seventh CNFET T37, and the source of the thirty-eighth CNFET T38 are all grounded. The gate of the first CNFET T1, the gate of the eighth CNFET T8, the gate of the thirteenth CNFET T13, the gate of the twenty-first CNFET T21, the gate of the twenty-fifth CNFET T25, and the gate of the twenty-seventh CNFET T27 are connected and a connecting terminal thereof are input with a third-bit signal of the first three-bit binary signal. The gate of the second CNFET T2, the gate of the third CNFET T3, the gate of the eighteenth CNFET T18, the gate of the twentieth CNFET T20, the gate of the thirty-first CNFET T31, and the gate of the thirty-second CNFET T32 are connected and a connecting terminal thereof are input with a third-bit signal of the first three-bit binary signal are connected and a connecting terminal thereof are input with a third-bit signal of the phase inverted signal of the second three-bit binary signal. The gate of the fourth CNFET T4, the gate of the fifteenth CNFET T15, the gate of the twenty-third CNFET T23, and the gate of the thirty-seventh CNFET T37 are connected and a connecting terminal thereof are input with a second-bit signal of the phase inverted signal of the second three-bit binary signal. The gate of the fifth CNFET T5, the gate of the twelfth CNFET T12, the gate of the fourteenth CNFET T14, the gate of the twenty-eighth CNFET T28, the gate of the thirtieth CNFET T30, and the gate of the thirty-fifth CNFET T35 are connected and a connecting terminal thereof are input with a first-bit signal of the first three-bit binary signal. The gate of the sixth CNFET T6, the gate of the ninth CNFET T9, the gate of the twenty-fourth CNFET T24, and the gate of the thirty-fourth CNFET T34 are connected and a connecting terminal thereof are input with a first-bit signal of the phase inverted signal of the second three-bit binary signal. The gate of the seventh CNFET T7, the gate of the sixteenth CNFET T16, the gate of the twenty-second CNFET T22, and the gate of the thirty-third CNFET T33 are connected and a connecting terminal thereof are input with a second-bit signal of the first three-bit binary signal. The gate of the tenth CNFET T10 and the gate of the thirty-sixth CNFET T36 are connected and a connecting terminal thereof are input with a second-bit signal of the second three-bit binary signal. The gate of the eleventh CNFET T11 and the gate of the twenty-ninth CNFET T29 are connected and a connecting terminal thereof are input with a second-bit signal of the phase inverted signal of the first three-bit binary signal. The gate of the seventeenth CNFET T17 and the gate of the twenty-sixth CNFET T26 are connected and a connecting terminal thereof are input with a first-bit signal of the phase inverted signal of the first three-bit binary signal. The gate of the nineteenth CNFET T19 and the gate of the thirty-eighth CNFET T38 are connected and a connecting terminal thereof are input with a first-bit signal of the second three-bit binary signal.

Figure 4:
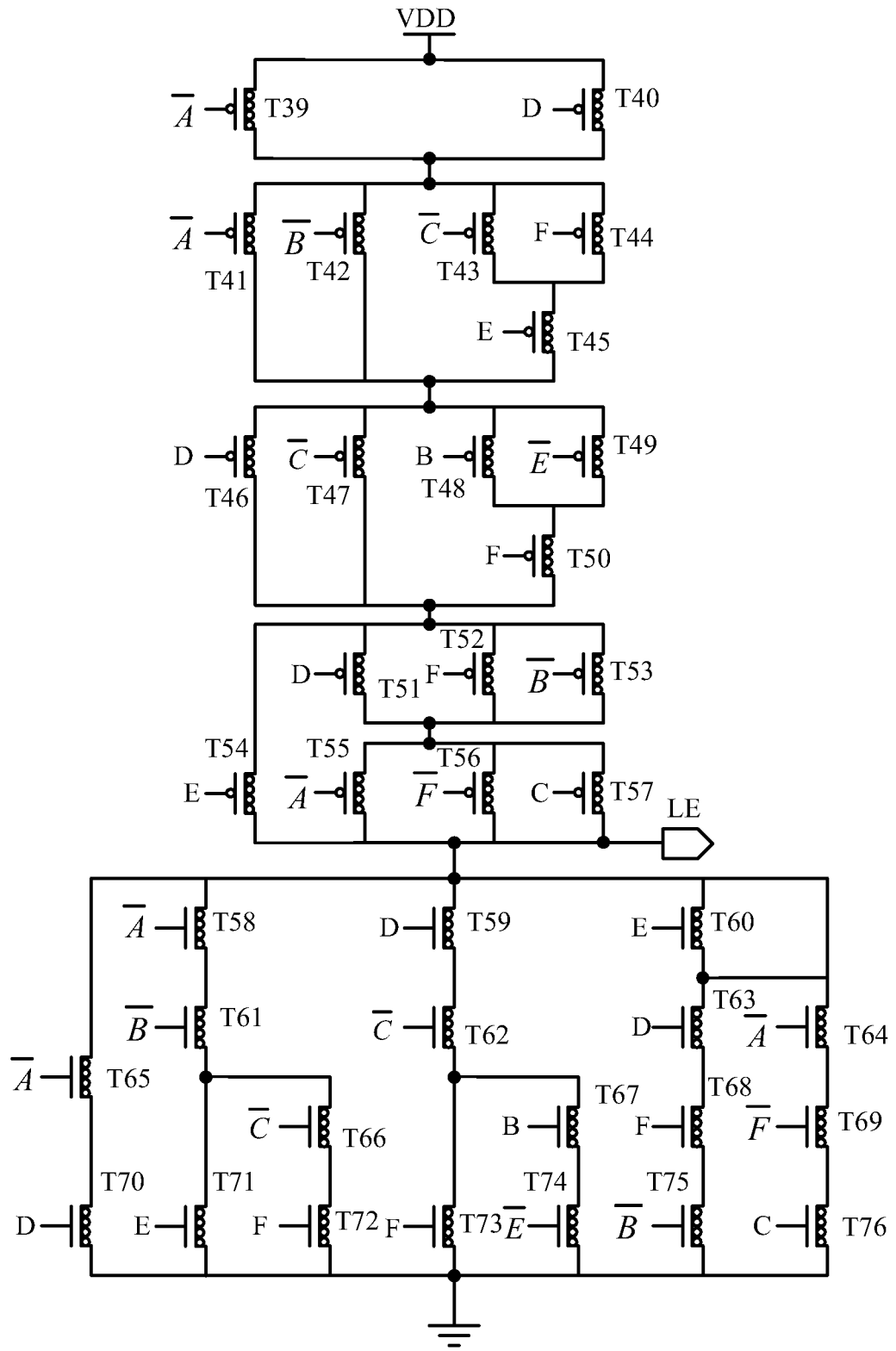
FIG. 4 is a circuit diagram of a second comparison unit according to one embodiment of the invention.

As shown in FIG. 4, the second comparison unit comprises: a thirty-ninth CNFET T39, a fortieth CNFET T40, a forty-first CNFET T41, a forty-second CNFET T42, a forty-third CNFET T43, a forty-fourth CNFET T44, a forty-fifth CNFET T45, a forty-sixth CNFET T46, a forty-seventh CNFET T47, a forty-eighth CNFET T48, a forty-ninth CNFET T49, a fiftieth-CNFET T50, a fifty-first CNFET T51, a fifty-second CNFET T52, a fifty-third CNFET T53, a fifty-fourth CNFET T54, a fifty-fifth CNFET T55, a fifty-sixth CNFET T56, a fifty-seventh CNFET T57, a fifty-eighth CNFET T58, a fifty-ninth CNFET T59, a sixtieth CNFET T60, a sixty-first CNFET T61, a sixty-second CNFET T62, a sixty-third CNFET T63, a sixty-fourth CNFET T64, a sixty-fifth CNFET T65, a sixty-sixth CNFET T66, a sixty-seventh CNFET T67, a sixty-eighth CNFET T68, a sixty-ninth CNFET T69, a seventieth CNFET T70, a seventy-first CNFET T71, a seventy-second CNFET T72, a seventy-third CNFET T73, a seventy-fourth CNFET T74, a seventy-fifth CNFET T75, and a seventy-sixth CNFET T76. Each of the above CNFET comprises: the gate, the drain, and the source.

The thirty-ninth CNFET T39, the fortieth CNFET T40, the forty-first CNFET T41, the forty-second CNFET T42, the forty-third CNFET T43, the forty-fourth CNFET T44, the forty-fifth CNFET T45, the forty-sixth CNFET T46, the forty-seventh CNFET T47, the forty-eighth CNFET T48, the forty-ninth CNFET T49, the fiftieth-CNFET T50, the fifty-first CNFET T51, the fifty-second CNFET T52, the fifty-third CNFET T53, the fifty-fourth CNFET T54, the fifty-fifth CNFET T55, the fifty-sixth CNFET T56, and the fifty-seventh CNFET T57 are all P-type CNFETs. The fifty-eighth CNFET T58, the fifty-ninth CNFET T59, the sixtieth CNFET T60, the sixty-first CNFET T61, the sixty-second CNFET T62, the sixty-third CNFET T63, the sixty-fourth CNFET T64, the sixty-fifth CNFET T65, the sixty-sixth CNFET T66, the sixty-seventh CNFET T67, the sixty-eighth CNFET T68, the sixty-ninth CNFET T69, the seventieth CNFET T70, the seventy-first CNFET T71, the seventy-second CNFET T72, the seventy-third CNFET T73, the seventy-fourth CNFET T74, the seventy-fifth CNFET T75, and the seventy-sixth CNFET T76 are all N-type CNFETs.

Both the source of the thirty-ninth CNFET T39 and the source of the fortieth CNFET T40 are connected to a power supplier. The drain of the thirty-ninth CNFET T39, the drain of the fortieth CNFET T40, the source of the forty-first CNFET T41, the source of the forty-second CNFET T42, the source of the forty-third CNFET T43, and the source of the forty-fourth CNFET T44 are connected. The drain of the forty-third CNFET T43, the drain of the forty-fourth CNFET T44, and the source of the forty-fifth CNFET T45 are connected. The drain of the forty-first CNFET T41, the drain of the forty-second CNFET T42, the drain of the forty-fifth CNFET T45, the source of the forty-sixth CNFET T46, the source of the forty-seventh CNFET T47, the source of the forty-eighth CNFET T48, and the source of the forty-ninth CNFET T49 are connected. The drain of the forty-eighth CNFET T48, the drain of the forty-ninth CNFET T49, and the source of the fiftieth-CNFET T50 are connected. The drain of the forty-sixth CNFET T46, the drain of the forty-seventh CNFET T47, the drain of the fiftieth-CNFET T50, the source of the fifty-first CNFET T51, the source of the fifty-second CNFET T52, the source of the fifty-third CNFET T53, and the source of the fifty-fourth CNFET T54 are connected. The drain of the fifty-first CNFET T51, the drain of the fifty-second CNFET T52, the drain of the fifty-third CNFET T53, the source of the fifty-fifth CNFET T55, the source of the fifty-sixth CNFET T56, and the source of the fifty-seventh CNFET T57 are connected. The drain of the fifty-fourth CNFET T54, the drain of the fifty-fifth CNFET T55, the drain of the fifty-sixth CNFET T56, the drain of the fifty-seventh CNFET T57, the drain of the fifty-eighth CNFET T58, the drain of the fifty-ninth CNFET T59, the drain of the sixtieth CNFET T60, and the drain of the sixty-fifth CNFET T65 are connected and a connecting terminal thereof is an output terminal of the less-than-or-equal-to signal. The source of the fifty-eighth CNFET T58 and the drain of the sixty-first CNFET T61 are connected. The source of the sixty-first CNFET T61, the drain of the seventy-first CNFET T71, and the drain of the sixty-sixth CNFET T66 are connected. The source of the sixty-sixth CNFET T66 and the drain of the seventy-second CNFET T72 are connected. The source of the sixty-fifth CNFET T65 and the drain of the seventieth CNFET T70 are connected. The source of the fifty-ninth CNFET T59 and the drain of the sixty-second CNFET T62 are connected. The source of the sixty-second CNFET T62, the drain of the seventy-third CNFET T73, and the drain of the sixty-seventh CNFET T67 are connected. The source of the sixty-seventh CNFET T67 and the drain of the seventy-fourth CNFET T74 are connected. The source of the sixtieth CNFET T60, the drain of the sixty-third CNFET T63, and the drain of the sixty-fourth CNFET T64 are connected. The source of the sixty-third CNFET T63 and the drain of the sixty-eighth CNFET T68 are connected. The source of the sixty-eighth CNFET T68 and the drain of the seventy-fifth CNFET T75 are connected. The source of the sixty-fourth CNFET T64 and the drain of the sixty-ninth CNFET T69 are connected. The source of the sixty-ninth CNFET T69 and the drain of the seventy-sixth CNFET T76 are connected. The source of the seventieth CNFET T70, the source of the seventy-first CNFET T71, the source of the seventy-second CNFET T72, the source of the seventy-third CNFET T73, the source of the seventy-fourth CNFET T74, the source of the seventy-fifth CNFET T75, and the source of the seventy-sixth CNFET T76 are all grounded.

The gate of the thirty-ninth CNFET T39, the gate of the forty-first CNFET T41, the gate of the fifty-fifth CNFET T55, the gate of the fifty-eighth CNFET T58, the gate of the sixty-fourth CNFET T64, and the gate of the sixty-fifth CNFET T65 are connected and a connecting terminal thereof are input with a third-bit signal of the phase inverted signal of the first three-bit binary signal. The gate of the fortieth CNFET T40, the gate of the forty-sixth CNFET T46, the gate of the fifty-first CNFET T51, the gate of the fifty-ninth CNFET T59, the gate of the sixty-third CNFET T63, and the gate of the seventieth CNFET T70 are connected and a connecting terminal thereof are input with a third-bit signal of the second three-bit binary signal. The gate of the forty-second CNFET T42, the gate of the fifty-third CNFET T53, the gate of the sixty-first CNFET T61, and the gate of the seventy-fifth CNFET T75 are connected and a connecting terminal thereof are input with the second-bit signal of the phase inverted signal of the first three-bit binary signal. The gate of the forty-third CNFET T43, the gate of the forty-seventh CNFET T47, the gate of the sixty-second CNFET T62, and the gate of the sixty-sixth CNFET T66 are connected and a connecting terminal thereof are input with the first-bit signal of the phase inverted signal of the first three-bit binary signal. The gate of the forty-fourth CNFET T44, the gate of the fiftieth-CNFET T50, the gate of the fifty-second CNFET T52, the gate of the sixty-eighth CNFET T68, the gate of the seventy-second CNFET T72, and the gate of the seventy-third CNFET T73 are connected and a connecting terminal thereof are input with the first-bit signal of the second three-bit binary signal. The gate of the forty-eighth CNFET T48 and the gate of the sixty-seventh CNFET T67 are connected and a connecting terminal thereof are input with the second-bit signal of the first three-bit binary signal. The gate of the forty-ninth CNFET T49 and the gate of the seventy-fourth CNFET T74 are connected and a connecting terminal thereof are input with the second-bit signal of the phase inverted signal of the second three-bit binary signal. The gate of the fifty-fourth CNFET T54, the gate of the forty-fifth CNFET T45, the gate of the sixtieth CNFET T60, and the gate of the seventy-first CNFET T71 are connected and a connecting terminal thereof are input with the second-bit signal of the second three-bit binary signal. The gate of the fifty-sixth CNFET T56 and the gate of the sixty-ninth CNFET T69 are connected and a connecting terminal thereof are input with the first-bit signal of the phase inverted signal of the second three-bit binary signal. The gate of the fifty-seventh CNFET T57 and the gate of the seventy-sixth CNFET T76 are connected and a connecting terminal thereof are input with the first-bit signal of the first three-bit binary signal.

Example 2

Figure 2:
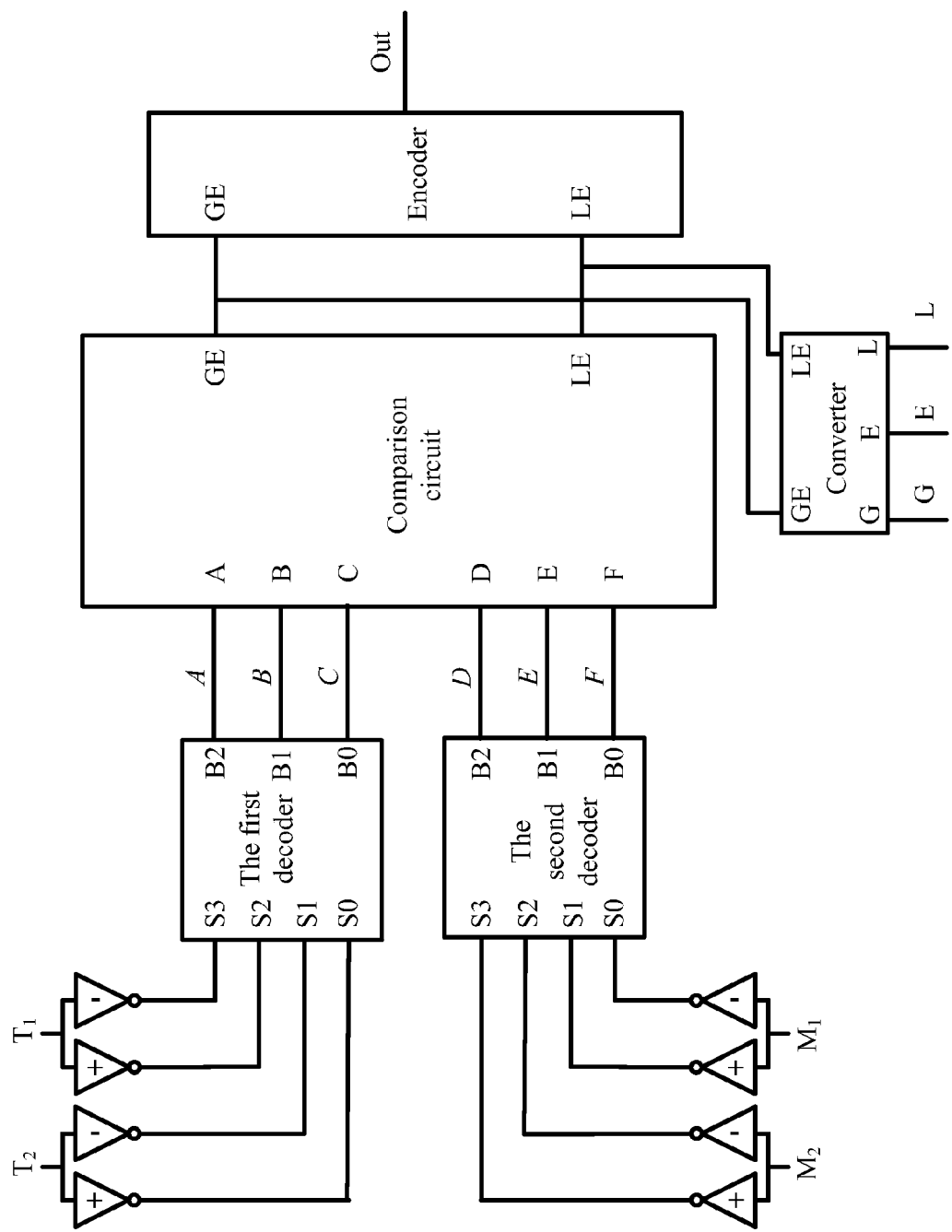
FIG. 2 is a second schematic diagram of a carbon nanotube-based ternary comparator according to one embodiment of the invention.

As shown in FIG. 2, a carbon nanotube-based ternary comparator, comprises: a first decoder, a second decoder, and a comparison circuit. A first two-bit ternary signal $T_2 T_1$ is input into a signal input terminal of the first decoder. A first three-bit binary signal ABC and a phase inverted signal $\overline{ABC}$ of the first three-bit binary signal ABC are output from a signal output terminal of the first decoder. A second two-bit ternary signal $M_2 M_1$ is input into a signal input terminal of the second decoder. A second three-bit binary signal DEF and a phase inverted signal $\overline{DEF}$ of the second three-bit binary signal are output from a signal output terminal of the second decoder. The comparison circuit comprises: a first comparison unit for producing a greater-than-or-equal-to signal GE and a second comparison unit for producing a less-than-or-equal-to signal LE.

As illustrated in FIG. 3, a circuit structure of the first comparison unit is the same as that in Example 1. As illustrated in FIG. 4, a circuit structure of the second comparison unit is the same as that in Example 2.

Figure 5:
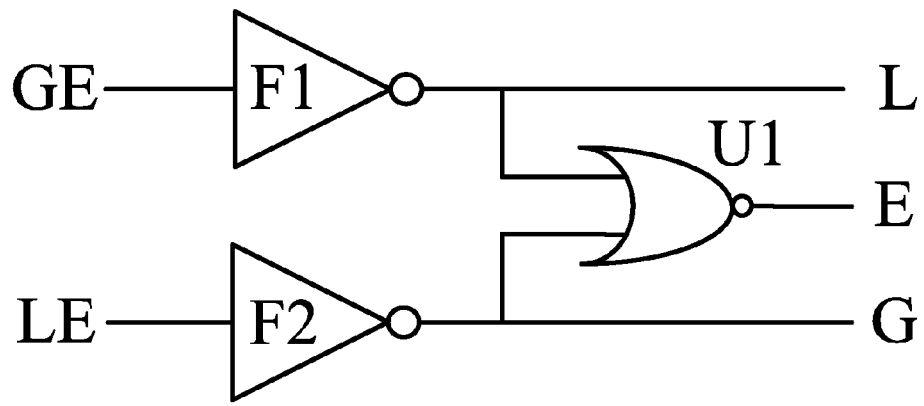
FIG. 5 is a circuit diagram of a converter according to one embodiment of the invention.

The carbon nanotube-based ternary comparator further comprises a converter. As shown in FIG. 5, the converter comprises: a first inverter F1, a second inverter F2, and a NOR gate U1. An input terminal of the first inverter F1 is connected to an output terminal for outputting the greater-than-or-equal-to signal. An input terminal of the second inverter F2 is connected to an output terminal for outputting the less-than-or-equal-to signal. An output terminal of the first inverter F1 is an output terminal for outputting a less-than signal L. An output terminal of the second inverter F2 is an output terminal for outputting a greater-than signal G. The output terminal of the first inverter F1 is connected to one input terminal of the NOR gate U1, and the output terminal of the second inverter F2 is connected to another input terminal of the NOR gate U2. An output terminal of the NOR gate U1 is an output signal for outputting an equal-to signal E.

Figure 6:
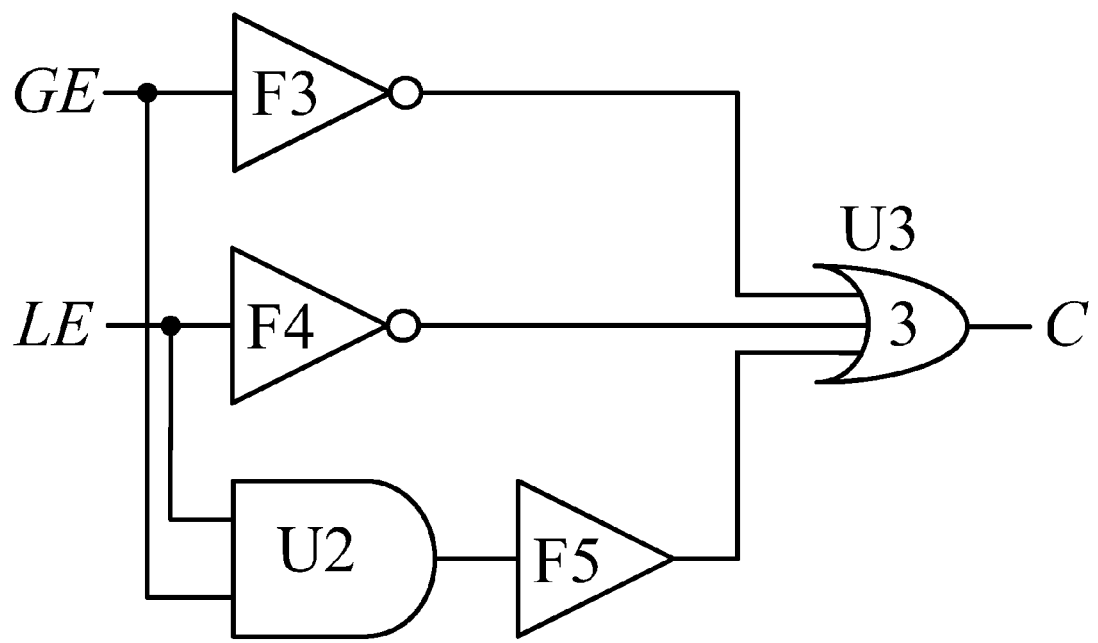
FIG. 6 is a circuit diagram of a decoder according to one embodiment of the invention.

The carbon nanotube-based ternary comparator further comprises a decoder. As shown in FIG. 6, the decoder comprises: a third inverter F3, a fourth inverter F4, a two-input AND gate U2, a buffer F5, and a three-input ternary NOR gate U3. An input terminal of the third inverter F3 and a first input terminal of the two-input AND gate U2 are connected to an output terminal for outputting a greater than and equal to signal. An input terminal of the fourth inverter F4 and a second input terminal of the two-input AND gate U2 are connected to an output terminal for outputting a less than and equal to signal. An output terminal of the two-input AND gate U2 is connected to an input terminal of the buffer F5. An output terminal of the buffer F5, an output terminal of the third inverter F3, and an output terminal of the further inverter F4 are connected to input terminals of the three-input ternary NOR gate U3, respectively, and an output terminal of the three-input ternary NOR gate U3 outputs a ternary comparison signal.

Figure 7:
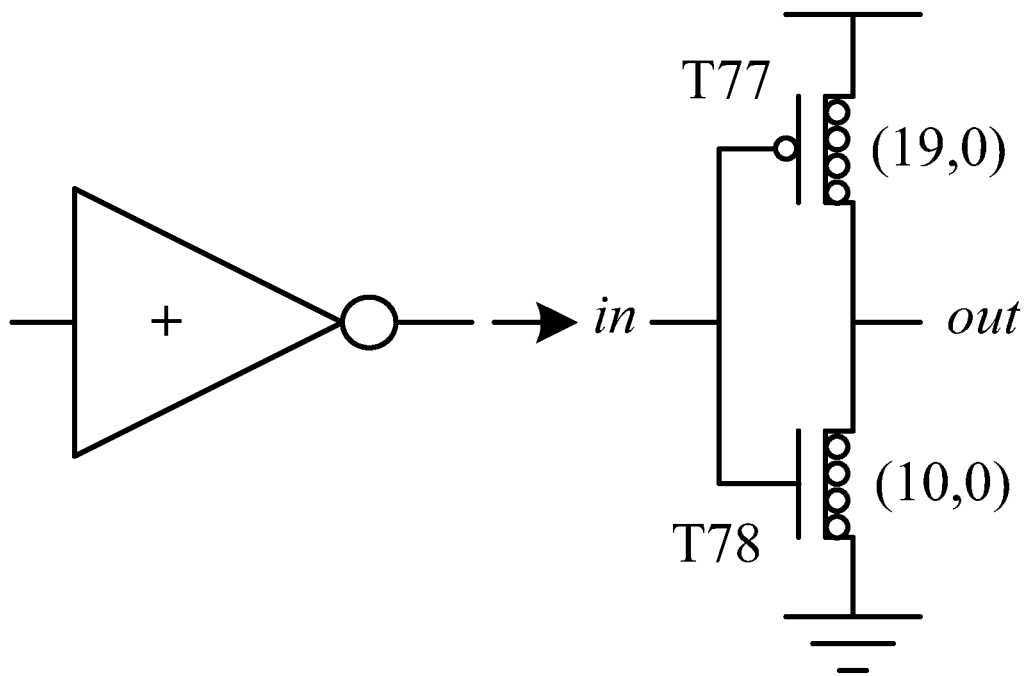
FIG. 7 is a circuit diagram of a first gate circuit according to one embodiment of the invention.
Figure 8:
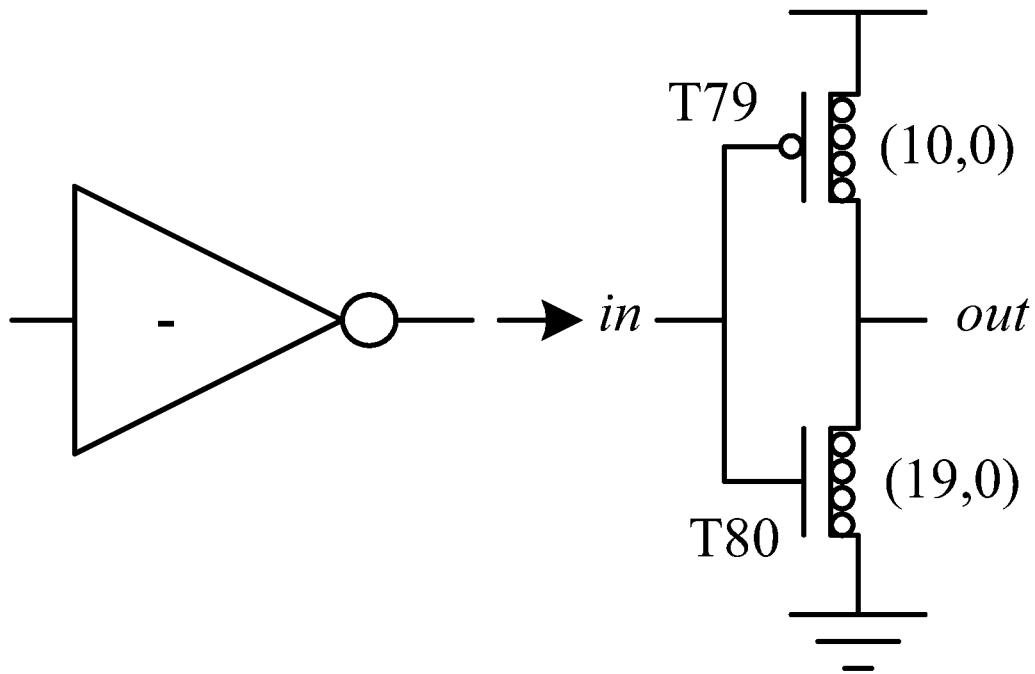
FIG. 8 is a circuit diagram of a second gate circuit according to one embodiment of the invention.

The carbon nanotube-based ternary comparator further comprises: a first gate circuit, a second gate circuit, and a third gate circuit, a fourth gate circuit, a fifth gate circuit, a sixth gate circuit, a seventh gate circuit, and an eighth gate circuit. As shown in FIG. 7, the first gate circuit comprises a seventy-seventh CNFET T77 and a seventy-eighth CNFET T78. The seventy-seventh CNFET T77 is the P-type CNFET, and a chiral vector (n, m) thereof is (19, 0). The seventy-eighth CNFET T78 is the N-type CNFET, and the chiral vector (n, m) thereof is (10, 0). The source of the seventy-seventh CNFET T77 is connected to a power supplier. The gate of the seventy-seventh CNFET T77 and the gate of a seventy-eighth CNFET T78 are connected and a connecting terminal thereof is an input terminal. The drain of the seventy-seventh CNFET T77 and the drain of the seventy-eighth CNFET T78 are connected and a connecting terminal thereof is an output terminal. The source of the seventy-eighth CNFET T78 is grounded. As shown in FIG. 8, the second gate circuit comprises: a seventy-ninth CNFET T79 and an eightieth CNFET T80. The seventy-ninth CNFET T79 is the P-type CNFET and the chiral vector (n, m) thereof is (10, 0). The eightieth CNFET T80 is the N-type CNFET and the chiral vector (n, m) thereof is (19, 0). The source of the seventy-ninth CNFET T79 is connected to a power supplier. The gate of a seventy-ninth CNFET T79 and the gate of the eightieth CNFET T80 are connected and a connecting terminal thereof is an input terminal. The drain of the seventy-ninth CNFET T79 and the drain of the eightieth CNFET T80 are connected and a connecting terminal thereof is an output terminal. The source of the eightieth CNFET T80 is grounded. Structures of the third gate circuit, the fifth gate circuit, and the seventh gate circuit are the same as that of the first gate circuit, and structures of the fourth gate circuit, the sixth gate circuit, and the eighth gate circuit are the same as that of the second gate circuit. A second-bit signal of the first two-bit ternary signal is input into the first decoder via the first gate circuit and the second gate circuit, and a first-bit signal of the first two-bit ternary signal is input into the first decoder via the third gate circuit and the fourth gate circuit. A second-bit signal of the second two-bit ternary signal is input into the second decoder via the fifth gate circuit and the sixth gate circuit, and a first-bit signal of the second two-bit ternary signal is input into the second decoder via the seventh gate circuit and the eighth gate circuit.

Figure 9:
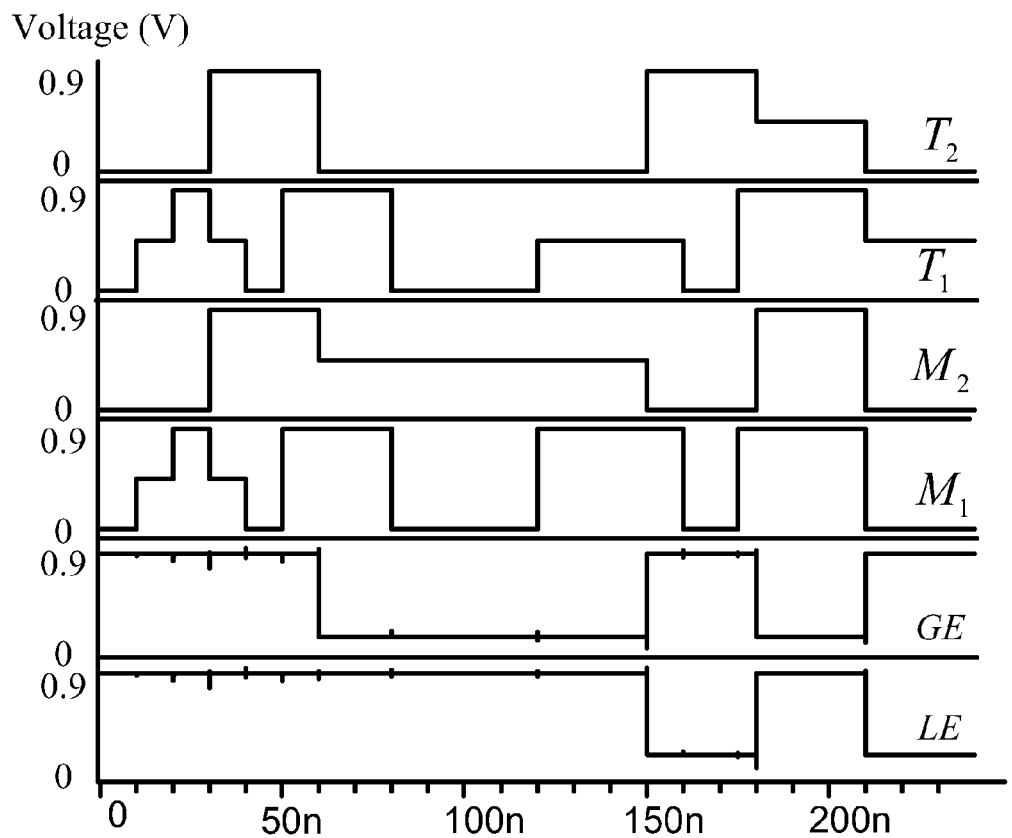
FIG. 9 shows analog waveforms of a carbon nanotube-based ternary comparator according to one embodiment of the invention.

The logic function and the power consumption of the designed circuit is simulated using HSPICE, and analog waveforms are illustrated in FIG. 9, designing parameters of the circuit adopts the CNFETs in a standard model: the chiral vector (n, m) is (19, 0), a supply voltage is VDD=0.9 V, a threshold voltage is $V_{th}$=0.29 V, a channel length of the CNFET is $L_{ch}$=32 nm, a free path within an inherent channel of the carbon nanotube is $L_{geff}$=100 nm, and lengths of the carbon nanotubes spread within a source region and a drain region are $L_{ss}$=32 nm and $L_{dd}$=32 nm, respectively, and a coupling capacitance between a tunnel region and a substrate is $C_{sub}$=20 pF/m. As shown in FIG. 9, $T_2$, $T_1$, $M_2$, and $M_1$ are input signals, GE and LE are output signals. When $T_2T_1$=$M_2M_1$, GE=LE=2; when $T_2T_1$>$M_2M_1$, GE=2 and LE=0; and when $T_2T_1$<$M_2M_1$, GE=0 and LE=2. It is known from the analog waveforms of FIG. 9 that the carbon nanotube-based ternary comparator designed in the invention possesses correct logic functions.

A power-delay product of the carbon nanotube-based ternary comparator of the invention is compared with those designed in the Document [1] (Lin S, Kim Y B, Lombardi F. CNTFET-based design of ternary logic gates and arithmetic circuits [J]. IEEE Transactions on nanotechnology, 2011, 10(2): 217-225) and Document [2] (Nan H, Ken C. Novel ternary logic design based on CNFET [C] SoC Design Conference. Tallinn: IEEE, 2010: 115-118), specific data are listed in Table 1:

TABLE 1

Comparison of power-delay product between comparators

| Two-bit comparator | Power (nw) | Delay (ps) | power-delay product ($\times 10^{-18}$ J) |
|---|---|---|---|
| Present invention | 89.0 | 23.8 | 2.118 |
| Document [1] | 95.9 | 42.5 | 4.076 |
| Document [2] | 63.8 | 145 | 9.251 |

Figure 10:
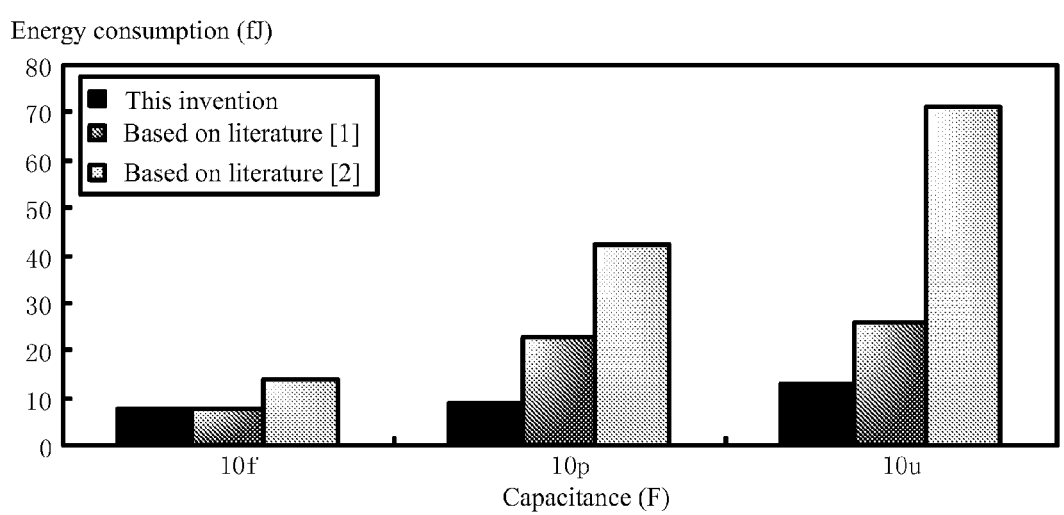
FIG. 10 shows comparison of power consumption between a carbon nanotube-based ternary comparator according to one embodiment of the invention and prior arts.

In condition of a fixed frequency of 12.5 MHz, power consumptions of carbon nanotube-based ternary comparator of the invention, the comparator of Document [1], and the comparator of Document [2] when connected to different output load capacitances are compared, and specific comparison results of the power consumptions are illustrated in FIG. 10, from which it is proved that the comparator of the invention adopting a serial carry architecture different from the conventional comparators is able to effectively avoid the disturbance of the output load on the internal circuit thereof, thereby realizing the low power consumption.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A comparator, comprising:
a first decoder, a second decoder, and a comparison circuit; each decoder comprising: a signal input terminal and a signal output terminal; the comparison circuit comprising: a first comparison unit for producing a greater-than-or-equal-to signal, and a second comparison unit for producing a less-than-or-equal-to signal;
the first comparison unit comprising: a first carbon nanotube field effect transistor (CNFET), a second CNFET, a third CNFET, a fourth CNFET, a fifth CNFET, a sixth CNFET, a seventh CNFET, an eighth CNFET, a ninth CNFET, a tenth CNFET, an eleventh CNFET, a twelfth CNFET, a thirteenth CNFET, a fourteenth CNFET, a fifteenth CNFET, a sixteenth CNFET, a seventeenth CNFET, an eighteenth CNFET, a nineteenth CNFET, a twentieth CNFET, a twenty-first CNFET, a twenty-second CNFET, a twenty-third CNFET, a twenty-fourth CNFET, a twenty-fifth CNFET, a twenty-sixth CNFET, a twenty-seventh CNFET, a twenty-eighth CNFET, a twenty-ninth CNFET, a thirtieth CNFET, a thirty-first CNFET, a thirty-second CNFET, a thirty-third CNFET, a thirty-fourth CNFET, a thirty-fifth CNFET, a thirty-sixth CNFET, a thirty-seventh CNFET, and a thirty-eighth CNFET;
the second comparison unit comprising: a thirty-ninth CNFET, a fortieth CNFET, a forty-first CNFET, a forty-second CNFET, a forty-third CNFET, a forty-fourth CNFET, a forty-fifth CNFET, a forty-sixth CNFET, a forty-seventh CNFET, a forty-eighth CNFET, a forty-ninth CNFET, a fiftieth-CNFET, a fifty-first CNFET, a fifty-second CNFET, a fifty-third CNFET, a fifty-fourth CNFET, a fifty-fifth CNFET, a fifty-sixth CNFET, a fifty-seventh CNFET, a fifty-eighth CNFET, a fifty-ninth CNFET, a sixtieth CNFET, a sixty-first CNFET, a sixty-second CNFET, a sixty-third CNFET, a sixty-fourth CNFET, a sixty-fifth CNFET, a sixty-sixth CNFET, a sixty-seventh CNFET, a sixty-eighth CNFET, a sixty-ninth CNFET, a seventieth CNFET, a seventy-first CNFET, a seventy-second CNFET, a seventy-third CNFET, a seventy-fourth CNFET, a seventy-fifth CNFET, and a seventy-sixth CNFET;
each of the CNFET comprising: a gate, a drain, and a source;
wherein:
a first two-bit ternary signal is input into the signal input terminal of the first decoder; a first three-bit binary signal and a phase inverted signal of the first three-bit binary signal are output from the signal output terminal of the first decoder; a second two-bit ternary signal is input into the signal input terminal of the second decoder; and a second three-bit binary signal and a phase inverted signal of the second three-bit binary signal are output from the signal output terminal of the second decoder;
the first CNFET, the second CNFET, the third CNFET, the fourth CNFET, the fifth CNFET, the sixth CNFET, the seventh CNFET, the eighth CNFET, the ninth CNFET, the tenth CNFET, the eleventh CNFET, the twelfth CNFET, the thirteenth CNFET, the fourteenth CNFET, the fifteenth CNFET, the sixteenth CNFET, the seventeenth CNFET, the eighteenth CNFET, and the nineteenth CNFET are all P-type CNFETs; and the twentieth CNFET, the twenty-first CNFET, the twenty-second CNFET, the twenty-third CNFET, the twenty-fourth CNFET, the twenty-fifth CNFET, the twenty-sixth CNFET, the twenty-seventh CNFET, the twenty-eighth CNFET, the twenty-ninth CNFET, the thirtieth CNFET, the thirty-first CNFET, the thirty-second CNFET, the thirty-third CNFET, the thirty-fourth CNFET, the thirty-fifth CNFET, the thirty-sixth CNFET, the thirty-seventh CNFET, and the thirty-eighth CNFET are all N-type CNFETs;
both the source of the first CNFET and the source of the second CNFET are connected to a power supplier; the drain of the first CNFET, the drain of the second CNFET, the source of the third CNFET, the source of the fourth CNFET, the source of the fifth CNFET, and the source of the sixth CNFET are connected together; the drain of the fifth CNFET, the drain of the sixth CNFET, and the source of the seventh CNFET are connected; the drain of the third CNFET, the drain of the fourth CNFET, the drain of the seventh CNFET, the source of the eighth CNFET, the source of the ninth CNFET, the source of the tenth CNFET, and the source of the eleventh CNFET are connected; the drain of the tenth CNFET, the drain of the eleventh CNFET, and the source of the twelfth CNFET are connected; the drain of the eighth CNFET, the drain of the ninth CNFET, the drain of the twelfth CNFET, the source of the thirteenth CNFET, the source of the fourteenth CNFET, the source of the fifteenth CNFET, and the source of the sixteenth CNFET are connected; the drain of the thirteenth CNFET, the drain of the fourteenth CNFET, the drain of the fifteenth CNFET, the source of the seventeenth CNFET, the source of the eighteenth CNFET, and the source of the nineteenth CNFET are connected; the drain of the sixteenth CNFET, the drain of the seventeenth CNFET, the drain of the eighteenth CNFET, the drain of the nineteenth CNFET, the drain of the twentieth CNFET, the drain of the twenty-first CNFET, the drain of the twenty-second CNFET, and the drain of the twenty-seventh CNFET are connected and a connecting terminal thereof is an output terminal of the greater-than-or-equal-to signal; the source of the twentieth CNFET and the drain of the twenty-third CNFET are connected; the source of the twenty-third CNFET, the drain of the thirty-third CNFET, and the drain of the twenty-eighth CNFET are connected; the source of the twenty-eighth CNFET and the drain of the thirty-fourth CNFET are connected; the source of the twenty-seventh CNFET and the drain of the thirty-second CNFET are connected; the source of the twenty-first CNFET and the drain of the twenty-fourth CNFET are connected; the source of the twenty-fourth CNFET, the drain of the thirty-fifth CNFET, and the drain of the twenty-ninth CNFET are connected; the source of the twenty-ninth CNFET and the drain of the thirty-sixth CNFET are connected; the source of the twenty-second CNFET, the drain of the twenty-fifth CNFET, and the drain of the twenty-sixth CNFET are connected; the source of the twenty-fifth CNFET and the drain of the thirtieth CNFET are connected, the source of the thirtieth CNFET and the drain of the thirty-seventh CNFET are connected; the source of the twenty-sixth CNFET and the drain of the thirty-first CNFET are connected; the source of the thirty-first CNFET and the drain of the thirty-eighth CNFET are connected; the source of the thirty-second CNFET, the source of the thirty-third CNFET, the source of the thirty-fourth CNFET, the source of the thirty-fifth CNFET, the source of the thirty-sixth CNFET, the source of the thirty-seventh CNFET, and the source of the thirty-eighth CNFET are all grounded; the gate of the first CNFET, the gate of the eighth CNFET, the gate of the thirteenth CNFET, the gate of the twenty-first CNFET, the gate of the twenty-fifth CNFET, and the gate of the twenty-seventh CNFET are connected and a connecting terminal thereof are input with a third-bit signal of the first three-bit binary signal; the gate of the second CNFET, the gate of the third CNFET, the gate of the eighteenth CNFET, the gate of the twentieth CNFET, the gate of the thirty-first CNFET, and the gate of the thirty-second CNFET are connected and a connecting terminal thereof are input with a third-bit signal of the phase inverted signal of the second three-bit binary signal; the gate of the fourth CNFET, the gate of the fifteenth CNFET, the gate of the twenty-third CNFET, and the gate of the thirty-seventh CNFET are connected and a connecting terminal thereof are input with a second-bit signal of the phase inverted signal of the second three-bit binary signal; the gate of the fifth CNFET, the gate of the twelfth CNFET, the gate of the fourteenth CNFET, the gate of the twenty-eighth CNFET, the gate of the thirtieth CNFET, and the gate of the thirty-fifth CNFET are connected and a connecting terminal thereof are input with a first-bit signal of the first three-bit binary signal; the gate of the sixth CNFET, the gate of the ninth CNFET, the gate of the twenty-fourth CNFET, and the gate of the thirty-fourth CNFET are connected and a connecting terminal thereof are input with a first-bit signal of the phase inverted signal of the second three-bit binary signal; the gate of the seventh CNFET, the gate of the sixteenth CNFET, the gate of the twenty-second CNFET, and the gate of the thirty-third CNFET are connected and a connecting terminal thereof are input with a second-bit signal of the first three-bit binary signal; the gate of the tenth CNFET and the gate of the thirty-sixth CNFET are connected and a connecting terminal thereof are input with a second-bit signal of the second three-bit binary signal; the gate of the eleventh CNFET and the gate of the twenty-ninth CNFET are connected and a connecting terminal thereof are input with a second-bit signal of the phase inverted signal of the first three-bit binary signal; the gate of the seventeenth CNFET and the gate of the twenty-sixth CNFET are connected and a connecting terminal thereof are input with a first-bit signal of the phase inverted signal of the first three-bit binary signal; and the gate of the nineteenth CNFET and the gate of the thirty-eighth CNFET are connected and a connecting terminal thereof are input with a first-bit signal of the second three-bit binary signal;

the thirty-ninth CNFET, the fortieth CNFET, the forty-first CNFET, the forty-second CNFET, the forty-third CNFET, the forty-fourth CNFET, the forty-fifth CNFET, the forty-sixth CNFET, the forty-seventh CNFET, the forty-eighth CNFET, the forty-ninth CNFET, the fiftieth-CNFET, the fifty-first CNFET, the fifty-second CNFET, the fifty-third CNFET, the fifty-fourth CNFET, the fifty-fifth CNFET, the fifty-sixth CNFET, and the fifty-seventh CNFET are all P-type CNFETs; and the fifty-eighth CNFET, the fifty-ninth CNFET, the sixtieth CNFET, the sixty-first CNFET, the sixty-second CNFET, the sixty-third CNFET, the sixty-fourth CNFET, the sixty-fifth CNFET, the sixty-sixth CNFET, the sixty-seventh CNFET, the sixty-eighth CNFET, the sixty-ninth CNFET, the seventieth CNFET, the seventy-first CNFET, the seventy-second CNFET, the seventy-third CNFET, the seventy-fourth CNFET, the seventy-fifth CNFET, and the seventy-sixth CNFET are all N-type CNFETs;

both the source of the thirty-ninth CNFET and the source of the fortieth CNFET are connected to a power supplier; the drain of the thirty-ninth CNFET, the drain of the fortieth CNFET, the source of the forty-first CNFET, the source of the forty-second CNFET, the source of the forty-third CNFET, and the source of the forty-fourth CNFET are connected; the drain of the forty-third CNFET, the drain of the forty-fourth CNFET, and the source of the forty-fifth CNFET are connected; the drain of the forty-first CNFET, the drain of the forty-second CNFET, the drain of the forty-fifth CNFET, the source of the forty-sixth CNFET, the source of the forty-seventh CNFET, the source of the forty-eighth CNFET, and the source of the forty-ninth CNFET are connected; the drain of the forty-eighth CNFET, the drain of the forty-ninth CNFET, and the source of the fiftieth-CNFET are connected; the drain of the forty-sixth CNFET, the drain of the forty-seventh CNFET, the drain of the fiftieth-CNFET, the source of the fifty-first CNFET, the source of the fifty-second CNFET, the source of the fifty-third CNFET, and the source of the fifty-fourth CNFET are connected; the drain of the fifty-first CNFET, the drain of the fifty-second CNFET, the drain of the fifty-third CNFET, the source of the fifty-fifth CNFET, the source of the fifty-sixth CNFET, and the source of the fifty-seventh CNFET are connected; the drain of the fifty-fourth CNFET, the drain of the fifty-fifth CNFET, the drain of the fifty-sixth CNFET, the drain of the fifty-seventh CNFET, the drain of the fifty-eighth CNFET, the drain of the fifty-ninth CNFET, the drain of the sixtieth CNFET, and the drain of the sixty-fifth CNFET are connected and a connecting terminal thereof is an output terminal of the less-than-or-equal-to signal; the source of the fifty-eighth CNFET and the drain of the sixty-first CNFET are connected; the source of the sixty-first CNFET, the drain of the seventy-first CNFET, and the drain of the sixty-sixth CNFET are connected; the source of the sixty-sixth CNFET and the drain of the seventy-second CNFET are connected; the source of the sixty-fifth CNFET and the drain of the seventieth CNFET are connected; the source of the fifty-ninth CNFET and the drain of the sixty-second CNFET are connected; the source of the sixty-second CNFET, the drain of the seventy-third CNFET, and the drain of the sixty-seventh CNFET are connected; the source of the sixty-seventh CNFET and the drain of the seventy-fourth CNFET are connected; the source of the sixtieth CNFET, the drain of the sixty-third CNFET, and the drain of the sixty-fourth CNFET are connected; the source of the sixty-third CNFET and the drain of the sixty-eighth CNFET are connected; the source of the sixty-eighth CNFET and the drain of the seventy-fifth CNFET are connected; the source of the sixty-fourth CNFET and the drain of the sixty-ninth CNFET are connected; the source of the sixty-ninth CNFET and the drain of the seventy-sixth CNFET are connected; the source of the seventieth CNFET, the source of the seventy-first CNFET, the source of the seventy-second CNFET, the source of the seventy-third CNFET, the source of the seventy-fourth CNFET, the source of the seventy-fifth CNFET, and the source of the seventy-sixth CNFET are all grounded; and the gate of the thirty-ninth CNFET, the gate of the forty-first CNFET, the gate of the fifty-fifth CNFET, the gate of the fifty-eighth CNFET, the gate of the sixty-fourth CNFET, and the gate of the sixty-fifth CNFET are connected and a connecting terminal thereof are input with a third-bit signal of the phase inverted signal of the first three-bit binary signal; the gate of the fortieth CNFET, the gate of the forty-sixth CNFET, the gate of the fifty-first CNFET, the gate of the fifty-ninth CNFET, the gate of the sixty-third CNFET, and the gate of the seventieth CNFET are connected and a connecting terminal thereof are input with a third-bit signal of the second three-bit binary signal; the gate of the forty-second CNFET, the gate of the fifty-third CNFET, the gate of the sixty-first CNFET, and the gate of the seventy-fifth CNFET are connected and a connecting terminal thereof are input with the second-bit signal of the phase inverted signal of the first three-bit binary signal; the gate of the forty-third CNFET, the gate of the forty-seventh CNFET, the gate of the sixty-second CNFET, and the gate of the sixty-sixth CNFET are connected and a connecting terminal thereof are input with the first-bit signal of the phase inverted signal of the first three-bit binary signal; the gate of the forty-fourth CNFET, the gate of the fiftieth-CNFET, the gate of the fifty-second CNFET, the gate of the sixty-eighth CNFET, the gate of the seventy-second CNFET, and the gate of the seventy-third CNFET are connected and a connecting terminal thereof are input with the first-bit signal of the second three-bit binary signal; the gate of the forty-eighth CNFET and the gate of the sixty-seventh CNFET are connected and a connecting terminal thereof are input with the second-bit signal of the first three-bit binary signal; the gate of the forty-ninth CNFET and the gate of the seventy-fourth CNFET are connected and a connecting terminal thereof are input with the second-bit signal of the phase inverted signal of the second three-bit binary signal; the gate of the fifty-fourth CNFET, the gate of the forty-fifth CNFET, the gate of the sixtieth CNFET, and the gate of the seventy-first CNFET are connected and a connecting terminal thereof are input with the second-bit signal of the second three-bit binary signal; the gate of the fifty-sixth CNFET and the gate of the sixty-ninth CNFET are connected and a connecting terminal thereof are input with the first-bit signal of the phase inverted signal of the second three-bit binary signal; and the gate of the fifty-seventh CNFET and the gate of the seventy-sixth CNFET are connected and a connecting terminal thereof are input with the first-bit signal of the first three-bit binary signal.

2. The comparator of claim 1, further comprising a converter; and the converter comprising: a first inverter, a second inverter, and a NOR gate;
wherein
an input terminal of the first inverter is connected to an output terminal for outputting the greater-than-or-equal-to signal;
an input terminal of the second inverter is connected to an output terminal for outputting the less-than-or-equal-to signal;
an output terminal of the first inverter is an output terminal for outputting a less-than signal;
an output terminal of the second inverter is an output terminal for outputting a greater-than signal;
the output terminal of the first inverter is connected to one input terminal of the NOR gate, and the output terminal of the second inverter is connected to another input terminal of the NOR gate; and
an output terminal of the NOR gate is an output signal for outputting an equal to signal.

3. The comparator of claim 1, further comprising a decoder;
and the decoder comprising: a third inverter, a fourth inverter, a two-input AND gate, a buffer, and a three-input ternary NOR gate; wherein an input terminal of the third inverter and a first input terminal of the two-input AND gate are connected to an output terminal for outputting a greater than and equal to signal;
an input terminal of the fourth inverter and a second input terminal of the two-input AND gate are connected to an output terminal for outputting a less than and equal to signal;
an output terminal of the two-input AND gate is connected to an input terminal of the buffer;
an output terminal of the buffer, an output terminal of the third inverter, and an output terminal of the fourth inverter are connected to input terminals of the three-input ternary NOR gate, respectively, and
an output terminal of the three-input ternary NOR gate outputs a ternary comparison signal.

4. The comparator of claim 1, further comprising:
a first gate circuit, a second gate circuit, and a third gate circuit, a fourth gate circuit, a fifth gate circuit, a sixth gate circuit, a seventh gate circuit, and an eighth gate circuit; the first gate circuit comprising a seventy-seventh CNFET and a seventy-eighth CNFET;
wherein
the seventy-seventh CNFET is the P-type CNFET, and a chiral vector (n, m) thereof is (19, 0); the seventy-eighth CNFET is the N-type CNFET, and the chiral vector (n, m) thereof is (10, 0); the source of the seventy-seventh CNFET is connected to a power supplier;
the gate of the seventy-seventh CNFET and the gate of a seventy-eighth CNFET are connected and a connecting terminal thereof is an input terminal; the drain of the seventy-seventh CNFET and the drain of the seventy-eighth CNFET are connected and a connecting terminal thereof is an output terminal; the source of the seventy-eighth CNFET is grounded; the second gate circuit comprises: a seventy-ninth CNFET and an eightieth CNFET; the seventy-ninth CNFET is the P-type CNFET and the chiral vector (n, m) thereof is (10, 0); the eightieth CNFET is the N-type CNFET and the chiral vector (n, m) thereof is (19, 0); the source of the seventy-ninth CNFET is connected to a power supplier; the gate of a seventy-ninth CNFET and the gate of the eightieth CNFET are connected and a connecting terminal thereof is an input terminal; the drain of the seventy-ninth CNFET and the drain of the eightieth CNFET are connected and a connecting terminal thereof is an output terminal; the source of the eightieth CNFET is grounded; structures of the third gate circuit, the fifth gate circuit, and the seventh gate circuit are the same as that of the first gate circuit, and structures of the fourth gate circuit, the sixth gate circuit, and the eighth gate circuit are the same as that of the second gate circuit; a second-bit signal of the first two-bit ternary signal is input into the first decoder via the first gate circuit and the second gate circuit, and a first-bit signal of the first two-bit ternary signal is input into the first decoder via the third gate circuit and the fourth gate circuit; and a second-bit signal of the second two-bit ternary signal is input into the second decoder via the fifth gate circuit and the sixth gate circuit, and a first-bit signal of the second two-bit ternary signal is input into the second decoder via the seventh gate circuit and the eighth gate circuit.

* * * * *